United States Patent
Caprara

(10) Patent No.: US 8,243,765 B2
(45) Date of Patent: *Aug. 14, 2012

(54) INTRACAVITY FREQUENCY-CONVERTED OPTICALLY-PUMPED SEMICONDUCTOR OPTICAL PARAMETRIC OSCILLATOR

(75) Inventor: Andrea Caprara, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 394 days.

This patent is subject to a terminal disclaimer.

(21) Appl. No.: 12/561,593

(22) Filed: Sep. 17, 2009

(65) Prior Publication Data

US 2010/0321765 A1      Dec. 23, 2010

Related U.S. Application Data

(63) Continuation-in-part of application No. 12/488,152, filed on Jun. 19, 2009, now Pat. No. 7,991,026.

(51) Int. Cl.
*H01S 3/10* (2006.01)

(52) U.S. Cl. .............. 372/22; 372/21; 372/100; 372/98; 372/75; 372/43.01

(58) Field of Classification Search ............ 372/22, 372/21, 100, 98, 75, 43.01
See application file for complete search history.

(56) References Cited

U.S. PATENT DOCUMENTS

| | | | |
|---|---|---|---|
| 5,991,318 A | 11/1999 | Caprara et al. | |
| 6,097,742 A | 8/2000 | Caprara et al. | |
| 6,108,356 A | 8/2000 | Yin | |
| 6,233,089 B1 | 5/2001 | Nebel | |
| 6,304,237 B1 | 10/2001 | Karakawa | |
| 6,480,325 B1 | 11/2002 | Batchko et al. | |
| 6,483,556 B1 | 11/2002 | Karakawa et al. | |
| 7,016,103 B2 | 3/2006 | Paschotta et al. | |
| 7,079,557 B1 | 7/2006 | Yin et al. | |
| 7,447,245 B2 | 11/2008 | Caprara et al. | |
| 7,991,026 B2 * | 8/2011 | Caprara | 372/22 |
| 2005/0163187 A1* | 7/2005 | Spinelli et al. | 372/94 |
| 2007/0291801 A1* | 12/2007 | Caprara et al. | 372/22 |

OTHER PUBLICATIONS

Notice of Allowance received for U.S. Appl. No. 12/488,152, mailed on Apr. 19, 2011, 14 pages.
U.S. Appl. No. 12/488,152, filed Jun. 19, 2009, by Andrea Caprara, entitled "Intracavity Frequency-Converted Optically-Pumped Semiconductor Laser with Red-Light Output," 16 pages in length.
D.J.M. Stothard et al., "Stable, continuous-wave, intracavity, optical parametric oscillator pumped by a semiconductor disk laser (VECSEL)," *Optics Express*, vol. 17, No. 13, Jun. 22, 2009, pp. 10648-10658.
International Search Report and Written Opinion received for PCT Patent Application No. PCT/US2010/038770, mailed on Sep. 13, 2010, 18 pages.

* cited by examiner

*Primary Examiner* — Kinam Park
(74) *Attorney, Agent, or Firm* — Morrison & Foerster LLP

(57) ABSTRACT

In a branched resonator OPS-laser arrangement, a combination of intra-cavity optical parametric generation and intra-cavity frequency conversion provides output radiation in a range between about 550 nanometers about 800 nanometers from an OPS fundamental wavelength in a range between about 900 nm and about 1100 nm.

21 Claims, 5 Drawing Sheets

INTRACAVITY FREQUENCY-CONVERTED OPTICALLY-PUMPED SEMICONDUCTOR OPTICAL PARAMETRIC OSCILLATOR

PRIORITY

This application is a continuation-in-part of U.S. patent application Ser. No. 12/488,152, filed Jun. 19, 2009, the disclosure of which is incorporated herein by reference.

TECHNICAL FIELD OF THE INVENTION

The present invention relates in general to optically-pumped external-cavity surface-emitting semiconductor lasers (OPS-Lasers). The invention relates in particular to intra-cavity frequency conversion in such lasers.

DISCUSSION OF BACKGROUND ART

An OPS-laser is increasingly being recognized as being a laser device that can provide a beam of continuous wave (CW) laser radiation of high brightness and high quality. An OPS-laser includes an OPS-structure typically comprising a multilayer mirror-structure surmounted by a semiconductor multilayer gain structure, with the layers epitaxially grown. The gain structure includes a plurality of active layers separated by barrier layers. The composition of the active layers primarily determines the lasing (peak-gain) wavelength.

In theory at least, there are semiconductor alloy material groups that can be used for such OPS-structures that will provide laser radiation at any wavelength from the ultraviolet to the mid infrared portions of the electromagnetic spectrum. In practice, only wavelengths in certain ranges can be generated with high power and reasonable efficiency. This can be due, inter alia, to lack of adequate conversion efficiency in a particular semiconductor alloy compositions, instability of an alloy, or lack of an adequate pump-light source.

By way of example blue-green and green wavelengths can in theory be generated in lasers made from II-VI semiconductor alloys. These must be pumped, however, by blue diode-lasers which at present have limited power output and efficiency. In practice, blue and blue-green wavelengths can be more efficiently and reliably generated by intra-cavity second-harmonic conversion (frequency-doubling) of the fundamental radiation of OPS-lasers made from III-V semiconductor alloys such as indium gallium arsenide phosphide (InGaAsP) which have relatively high conversion efficiency and can be pumped with radiation from III-V diode-lasers which also have high conversion efficiency.

There are laser applications that require several Watts (W) of high quality beam power in the orange and red regions of the visible spectrum. Red laser light having a wavelength of about 630 nanometers (nm) is useful in laser display applications. Orange and yellow laser light having a wavelength between about 570 nm and 590 nm is useful in certain laser skin-treatments. Unfortunately, in an OPS-laser system, none of these wavelengths can be efficiently generated with adequate power and efficiency as a fundamental wavelength beam, or by harmonic-conversion of a fundamental wavelength beam having a wavelength two or more times longer than the red, orange, or yellow wavelength.

Further, although an OPS-structure based on any given semiconductor alloy system may be configured to operate at any one wavelength within a range of wavelengths characteristic of that alloy system, the configuration may involve a relatively lengthy experimental effort. This is because a new configuration has to be optimized for minimizing stress or strain from the growth process, and to refine the composition of the quantum-well layers from a theoretical composition to provide the actual wavelength. If the volume of OPS-structures (chips) required is relatively small, the optimization effort can add significantly and even prohibitively to the unit cost.

SUMMARY OF THE INVENTION

In one aspect of the present invention, a method of generating optical radiation comprises generating laser radiation having a fundamental wavelength with a gain medium in the form of an optically pumped semiconductor (OPS). The fundamental-wavelength radiation is circulated through a first optically nonlinear crystal arranged to divide a portion of the circulating fundamental wavelength radiation into signal-wavelength and idler-wavelength radiation portions, the signal wavelength being longer than the fundamental wavelength and shorter than the idler wavelength. The signal-wavelength radiation is circulated through a second optically nonlinear crystal arranged to generate output-radiation by frequency-converting the signal radiation.

In one embodiment of the inventive method, the frequency-conversion of the signal wavelength radiation is effected by sum-frequency mixing the signal wavelength radiation with the fundamental radiation. In another embodiment of the inventive method, the frequency-conversion of the signal wavelength radiation is effected by frequency doubling the signal-frequency radiation.

In another aspect of the present invention, optical apparatus comprises first and second resonators having first and second portions with the first resonator portions being coaxial and the second portions separate. An OPS-structure located in the second portion of the first resonator. An arrangement is provided for delivering optical pump radiation to the OPS-structure such that laser radiation having a fundamental wavelength circulates in the first resonator. A first optically nonlinear crystal is located in the coaxial first portions of the first and second resonators and arranged for optical parametric division of a portion of the fundamental wavelength radiation into signal radiation and idler radiation portions, the signal radiation portion having a wavelength greater than the wavelength of the fundamental-wavelength radiation and less than the wavelength of the idler radiation portion. An optical arrangement is provided for directing the signal radiation into the second portion of the second resonator such that signal radiation circulates in the second resonator. A second optically nonlinear crystal is located in the second resonator, the second optically nonlinear crystal being arranged for frequency-converting circulating signal radiation to a wavelength shorter than the wavelength of the circulating fundamental wavelength radiation.

The frequency conversion may be effected by either sum-frequency mixing the signal radiation with the fundamental radiation or by frequency doubling the signal radiation. For sum-frequency mixing, the second optically nonlinear crystal is located in the coaxial first portions of the first and second resonators. For frequency doubling, the second optically nonlinear crystal may be located in the first or second portion of the second resonator.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
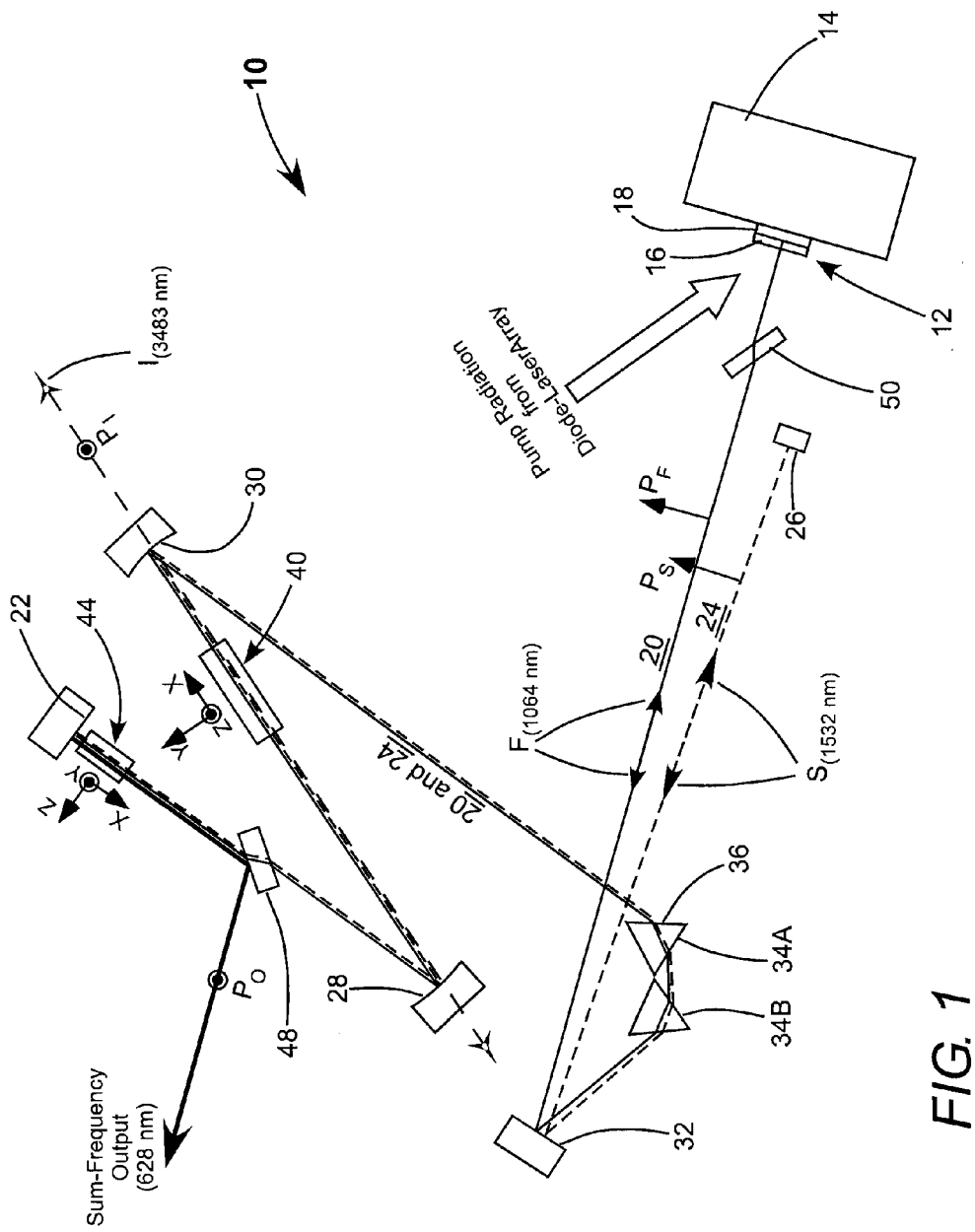
FIG. 1 schematically illustrates one preferred embodiment of laser apparatus in accordance with the present invention wherein a portion of fundamental radiation generated in an OPS-laser resonator is converted by optical parametric division to signal and idler radiation in a first optically nonlinear crystal and a residual portion of the fundamental radiation is sum-frequency mixed with signal radiation in a second optically nonlinear crystal to provide output radiation.

Referring now to the drawings, wherein like components are designated by like reference numerals, FIG. 1 schematically illustrates a preferred embodiment 10 of an intra-cavity frequency-converted OPS-laser in accordance with the present invention. Laser 10 includes an OPS-structure (OPS-Chip) 12 mounted on a heat sink 14. OPS-chip 12 includes an epitaxially-grown multilayer semiconductor gain-structure 16 surmounting a mirror-structure 18. Semiconductor gain-structure 16 is a III-V semiconductor structure having active or quantum well layers separated by spacer layers, with the active layers formulated to provide peak gain at a wavelength between about 950 nm and 1100 nm, i.e., a near infrared (NIR) wavelength. For purposes of this description it is assumed that the peak-gain of gain-structure 16 is selected to be 1064 nm. Methods of fabricating OPS-chips are well known in the art to which the present invention pertains and a description thereof is not necessary for understanding principles of the present invention. Accordingly, no such description is provided herein. A detailed description of fabricating OPS-chips, particularly III-V NIR chips, is provided in U.S. Pat. No. 6,097,742, assigned to the assignee of the present invention and the complete disclosure of which is hereby incorporated by reference.

An OPS-laser resonator 20 is formed between a plane mirror 22 and mirror-structure 18 of the OPS-chip 12. A passive resonator 24 is formed between mirror 22 and a plane mirror 26. Each resonator is folded by a concave mirror 28, a concave mirror 30, prisms 34A and 34B, and a plane mirror 32.

Pump radiation from a diode-laser array is directed onto gain-structure 16 of OPS-chip 12 causing fundamental radiation F to circulate in resonator 20. Radiation F is assumed in this example to have a wavelength of 1064 nm as noted above. The path of the fundamental is designated in FIG. 1 by a fine solid line. Those skilled in the art will recognize without further detailed description or illustration that the pump radiation may be delivered via a fiber or a fiber bundle, or projected by suitable optics directly from a diode-laser or array thereof onto the gain-structure.

Located at a beam-waist location of the circulating fundamental radiation between concave mirrors 28 and 30 is an optically nonlinear crystal 40 arranged for type-III optical parametric conversion (frequency division) of a portion of the fundamental radiation into a signal portion S and an idler portion I. The principal axes X, Y, and Z of crystal 40 are indicated. The portion converted depends, inter alia, on the fundamental radiation intensity within the crystal and the material of the crystal.

In this example, it is assumed that crystal 40 is a crystal of potassium titanyl arsenate (KTA), and the signal and idler portions have wavelengths of about 1532 nm and about 3483 nm, respectively. The path of the signal radiation is designated in FIG. 1 by a short-dashed line, and the path of the idler radiation is designated by a long-dashed line. Another possible optically nonlinear crystal for providing the optical parametric division is rubidium titanyl arsenate (RTA).

The fundamental, signal, and idler radiations are all plane-polarized. The polarization-orientation of the fundamental and signal radiations are the same, here, in the plane of FIG. 1 as indicated by arrows $P_F$ and $P_S$. The polarization orientation of the fundamental radiation is selected by a birefringent filter (BRF) 50, which also selects the wavelength of the fundamental radiation from the gain-bandwidth of gain-structure 16. The polarization-orientation of the idler radiation is perpendicular to the orientation of the fundamental and signal radiations (perpendicular to the plane of the drawing) as indicated by arrowhead $P_I$.

Mirrors 22, 28, 30, and 32 are each highly reflective for the fundamental and signal wavelengths. Mirrors 28 and 30 are highly transparent at the idler wavelength, mirror 26 is maximally reflective at the signal wavelength, and, of course, mirror structure 18 of OPS chip 12 is highly reflective at the fundamental wavelength. Prisms 34A and 34B are preferably isosceles Brewster prisms preferably of lithium triborate (LBO) and with an apex angle of 63.8°. Signal radiation S circulates in resonator 24 with essentially no signal radiation being allowed to escape from the resonator. Idler radiation is discarded from the resonator by transmission through mirrors 28 and 30. Resonators 20 and 24 are collinear (coaxial) between mirror 22 and face 36 of prism 34A. The different fundamental and signal wavelengths result in prisms 34A and 34B causing angular separation of the fundamental and signal radiations and accordingly branching of the axes of resonators 20 and 24.

It should be noted here that dichroic-mirror (filter) separation or branching of the resonator paths is possible, in theory at least, in the inventive apparatus. However, as the fundamental and signal radiations have the same polarization orientation, normal manufacturing tolerances on commercial dichroic filters could result in significant loss in the one of the resonators that was transmitted through the dichroic mirror. Incidence of the fundamental and signal radiations on the prism faces at or near the Brewster angle for the prism material provides that near lossless branching of the resonators is possible.

It is estimated that for a pump power of about 50 W delivered to gain-structure 16 of OPS chip about 600 W of fundamental radiation and about 250 W of signal radiation would circulate together in the coaxial portion of resonators 20 and 24. There is a beam-waist location for both the fundamental and signal radiations adjacent mirror 22. Located at this beam-waist location is an optically nonlinear crystal 44, preferably of LBO with principal axes indicated, arranged for type-1, non-critical, sum-frequency mixing of the signal and fundamental wavelengths to generate sum-frequency radiation plane-polarized in an orientation perpendicular to that of the fundamental and signal radiations as indicated by arrowhead $P_O$. The sum-frequency radiation is designated in FIG. 1 by a bold solid line, and has a (red) wavelength of about 628 nm for the exemplified wavelengths of fundamental and signal radiations. For a 3 mm-long LBO crystal, the total interaction length is 6 millimeters (mm), since the signal and fundamental radiation traverse the crystal in both a forward and backward direction. For a fundamental beam radius of 50 microns in the crystal, and a signal beam radius of 60 microns, it is estimated that about 5 Watts of sum frequency radiation at 628 nm is generated.

The sum-frequency radiation is directed out of the coaxial portion of resonators 20 and 24 by a polarization-sensitive dichroic beamsplitter 48. The beamsplitter is arranged such that fundamental and signal radiations are incident thereon at or near the Brewster angle and P-polarized with respect to the beamsplitter. This minimizes losses in resonators 20 and 24. The sum-frequency radiation is S-polarized with respect to beamsplitter 48 and is reflected out of the resonators as output radiation.

It is preferable that the phase-matching bandwidth for the sum-frequency generation process in optically nonlinear crystal 44 is substantially greater than the phase-matching bandwidth for the parametric frequency division process in optically nonlinear crystal 40. If such a condition is not fulfilled, the signal resonator (resonator 24) could oscillate at a frequency outside the sum-frequency process bandwidth but still within the parametric generation bandwidth, since by doing so it will not generate any red (sum-frequency) radiation and accordingly minimize losses.

For this and other reasons, LBO is a particularly preferred material for crystal 44 as it has a very large bandwidth for the sum-frequency generation process. By way of example if the fundamental radiation has a wavelength of 1064 nm, the signal radiation wavelength can be varied by more than ±50 nm around the nominal value of 1543 nm without a noticeable decrease in the efficiency of the sum-frequency generation process. In contrast, the bandwidth of the parametric generation process for a 6 mm-long KTA crystal falls to one-half of its peak value as the signal wavelength varies by only ±0.5 nm. In addition LBO provides for non-critical phase-matching near room temperature for generation of all of the yellow to red wavelengths of interest from about 550 nm to about 700 nm. In particular the temperature for sum-frequency generation of 628 nm output-radiation with a signal wavelength of 1064 nm is estimated to be about 15.6 Celsius, and the temperature for sum-frequency generation of 575 nm output radiation with a signal wavelength of 980 nm is estimated to be about 50.7 Celsius. Preferably, crystal 44 is mounted on a thermo-electric cooling TEC device, or the like, to maintain the temperature of the crystal at a desired level.

Figure 2:
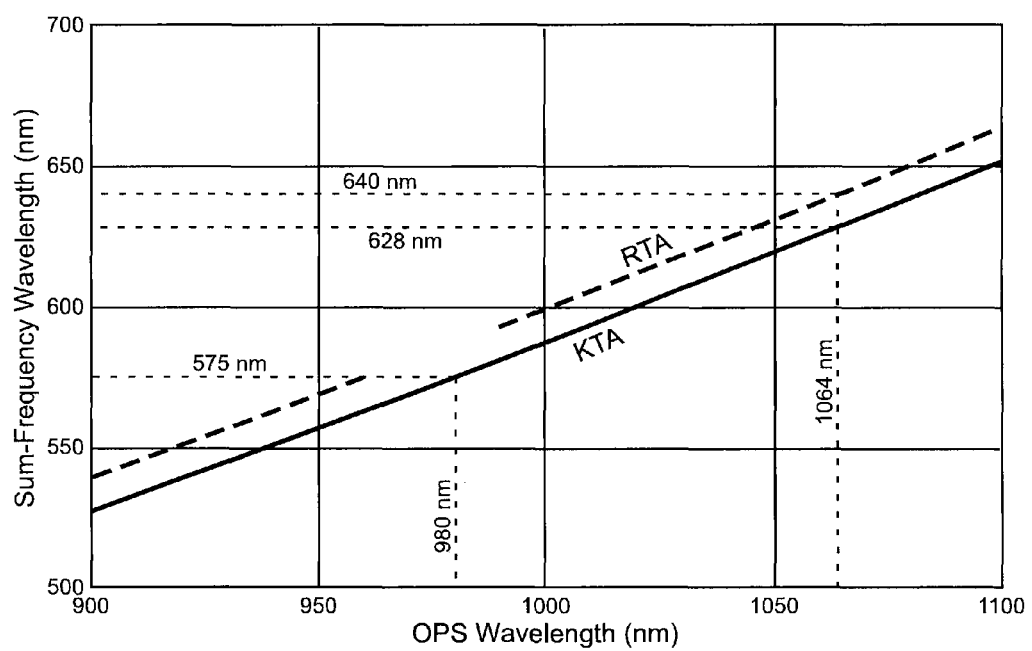
FIG. 2 is a graph schematically illustrating the output radiation wavelength as a function of the fundamental radiation wavelength for second optically nonlinear crystals of RTA and KTA.

FIG. 2 is a graph schematically illustrating the sum-frequency output as a function of the OPS-laser fundamental wavelength for an optically nonlinear crystal 40 of KTA (solid curve) and RTA (dashed curves). An OPS-laser wavelength of about 1064 nm provides about 628 nm output using a KTA crystal as crystal 40, and about 640 nm output using an RTA crystal as crystal 40. An OPS-laser wavelength of about 980 nm provides about 575 nm output using a KTA crystal as crystal 40. The wavelengths 980 nm and 1064 nm are readily available in OPS chips as they are preferred wavelengths for fiber-laser pumping and as fundamental wavelengths, and for intra-cavity frequency-doubling to provide green and blue-green wavelengths. Note that while FIG. 2 indicates that the arrangement of FIG. 1 can be used to provide green-wavelengths, such green-wavelengths are more efficiently provided by frequency-doubling as noted above.

The embodiment described above relies on a combination of resonant intra-cavity parametric generation in a first optically nonlinear crystal and resonant sum-frequency mixing in a second optically non linear crystal, in a branched resonator, to provide sum-frequency output at yellow to red wavelengths. An OPS-structure provides fundamental radiation for the parametric generation and sum-frequency mixing processes. The first optically nonlinear crystal provides, through the nonlinear parametric process, amplification for signal wavelength radiation such that the signal wavelength radiation circulates with high intensity, which combined with a high circulating fundamental radiation intensity allows resonant sum-frequency mixing to generate multi Watt level, CW, sum-frequency output. In one arrangement wherein 628 nm-wavelength sum-frequency radiation is generated from 1064 nm-wavelength OPS-laser radiation, it is estimated that about 5 Watts of sum-frequency radiation can be generated from 50 Watts of pump power delivered to the OPS-structure.

Those skilled in the art will recognize that while the present invention is described above with reference to generating CW radiation, this CW radiation could be modulated, for example by modulating the pump radiation delivered to the OPS chip. Those skilled in the art may also devise other resonator arrangements for carrying out the combination of intra-cavity parametric generation and sum-frequency mixing without departing from the spirit and scope of the present invention.

It is emphasized, here, however, that while 1064 nm radiation can be generated by diode-pumping a solid state-gain medium such as neodymium-doped YAG (Nd:YAG) or neodymium doped yttrium vanadate (Nd:YVO$_4$) such solid-state gain-media are unsuitable for providing fundamental radiation in a resonator of the inventive laser. This is because such solid-state gain media have relatively long excited-state lifetimes which, in combination with the presence of two optically non-linear crystals in the resonator, would allow spurious, short-lived relaxation oscillations in the resonator, which in turn would lead to unacceptable noise and instability in the sum-frequency output.

Figure 3:
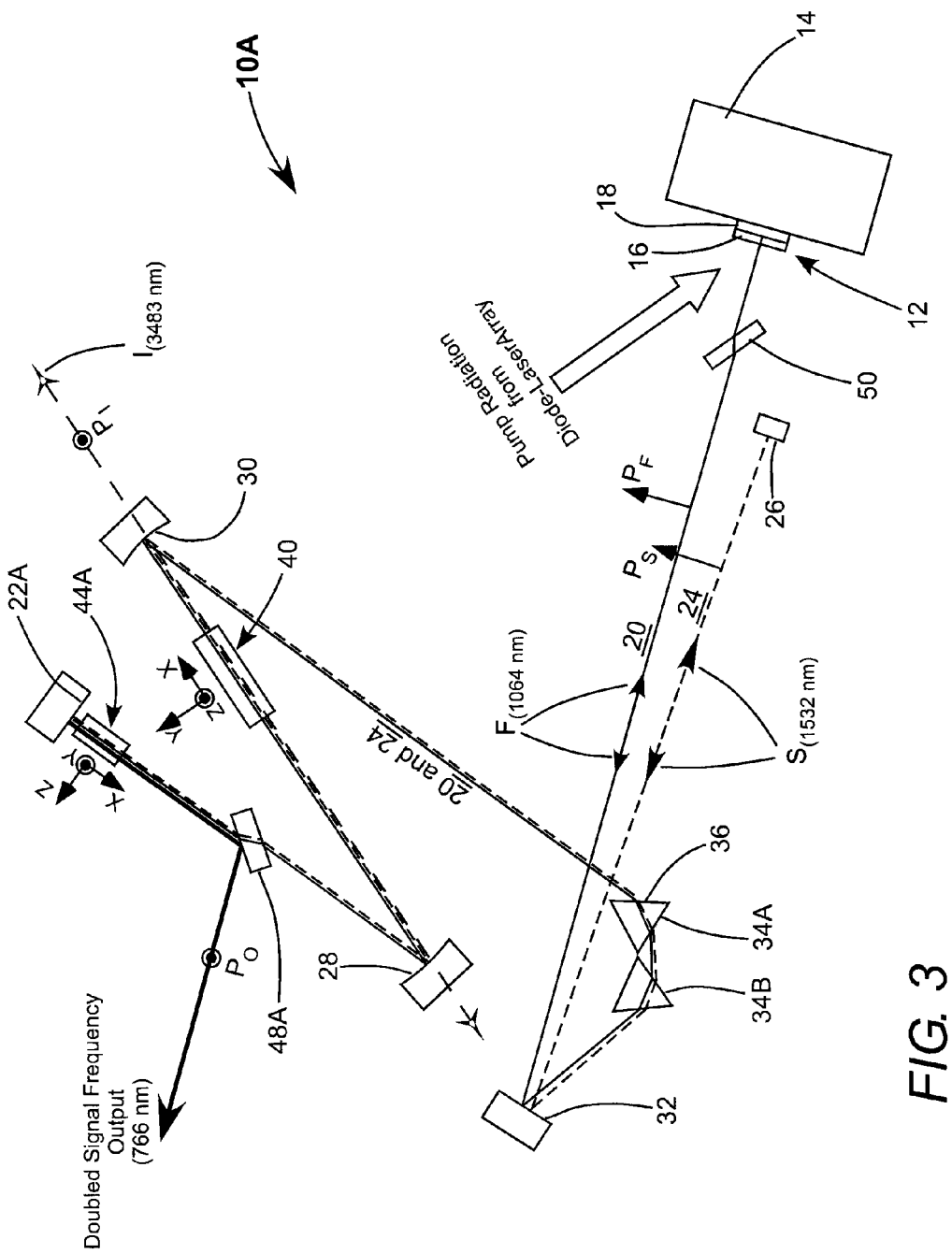
FIG. 3 schematically illustrates another preferred embodiment of laser apparatus in accordance with the present invention similar to the apparatus of FIG. 1, but wherein the portion of fundamental radiation generated in the OPS-laser resonator is converted by optical parametric division to signal and idler radiation in a first optically nonlinear crystal the signal radiation is frequency-doubled in the second optically nonlinear crystal to provide output radiation.

FIG. 3 schematically illustrates another preferred embodiment 10A of laser apparatus in accordance with the present invention. Apparatus 10A is similar to apparatus 10 to the apparatus of FIG. 1, with an exception that the temperature of optically nonlinear crystal 44 (here designated as crystal 44A to differentiate) is raised outside of the range for sum-frequency mixing to a temperature at which the crystal is phase-matched for frequency doubling the signal radiation. In this example, doubling the 1532 nm signal radiation provides output radiation having a wavelength of 766 nm. It should be noted, for completeness of description, that mirror 22 of apparatus 10 is replaced in apparatus 10A by a minor 22A that is highly reflective for the signal radiation, fundamental radiation and the frequency-doubled signal radiation. Dichroic beamsplitter 48 of apparatus 10 is replaced in apparatus 10A by a dichroic beamsplitter 48A that is highly transmissive for signal and fundamental radiation and highly reflective for the frequency-doubled signal radiation. It should also be noted that it is preferable that the phase-matching bandwidth for the frequency-doubling process in optically nonlinear crystal 44A be substantially greater than the phase-matching bandwidth for the parametric frequency division process in optically nonlinear crystal 40.

Figure 4:
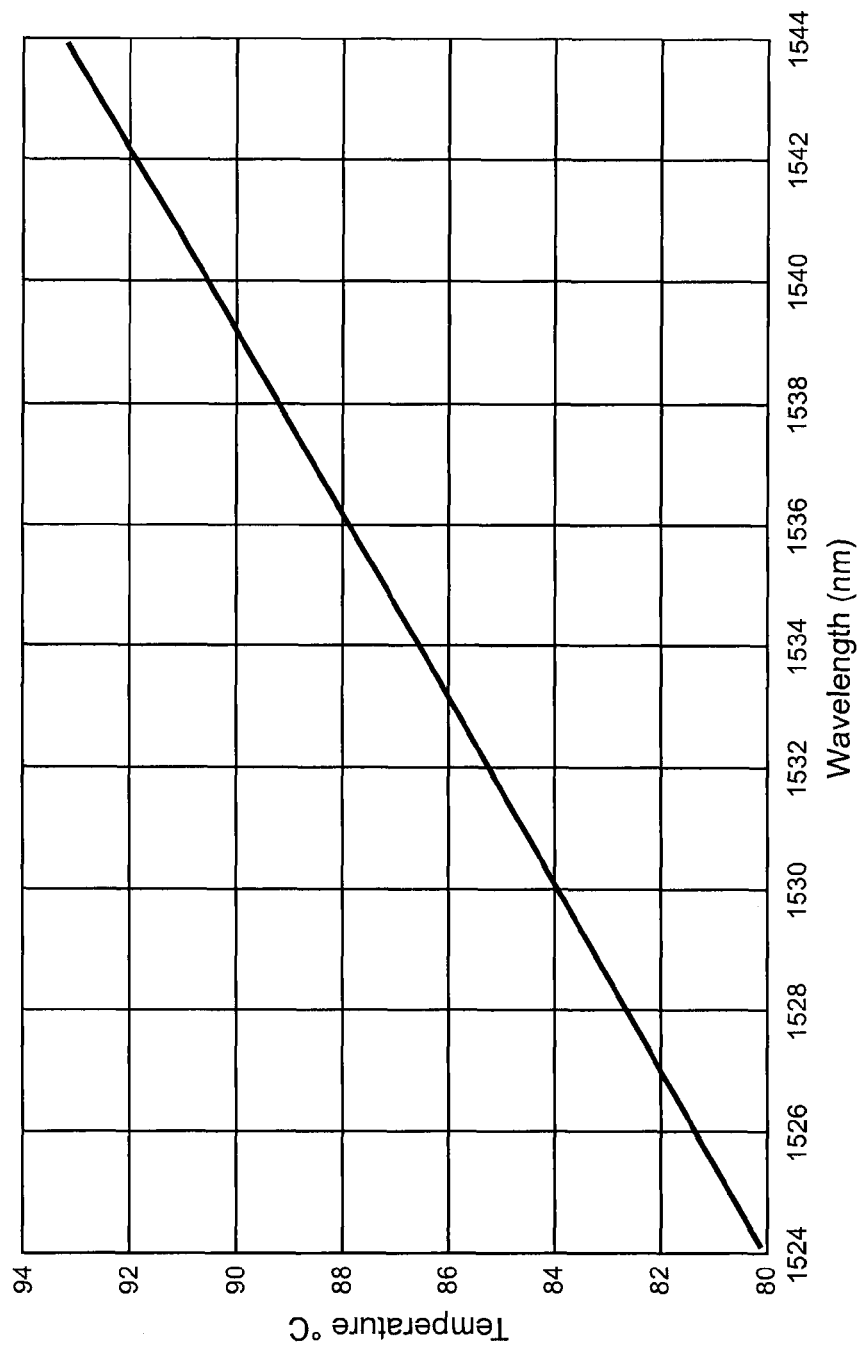
FIG. 4 is a graph schematically illustrating the calculated phase-matching wavelength for frequency-doubling as a function of temperature of the second optically nonlinear crystal in the apparatus of FIG. 3.

FIG. 4 is a graph schematically illustrating the calculated phase-matching wavelength for frequency-doubling as a function of temperature of optically nonlinear crystal 44 in the apparatus of FIG. 3. It can be seen that a temperature of about 85.2° C. is required for phase matching at a signal wavelength of 1532 nm.

While the apparatus configuration of FIG. 1 and FIG. 3 conveniently allows for frequency-doubling the signal radiation or sum-frequency mixing signal and fundamental radiation merely by changing the temperature of an optically nonlinear crystal, this configuration is arguably not optimum for frequency-doubling of the signal radiation. This is because the fundamental radiation circulates through the crystal 44a even though it is not part of the doubling process. This fundamental radiation passing through the crystal 44a at relatively high power adds to the thermal load experienced by the crystal.

Figure 5:
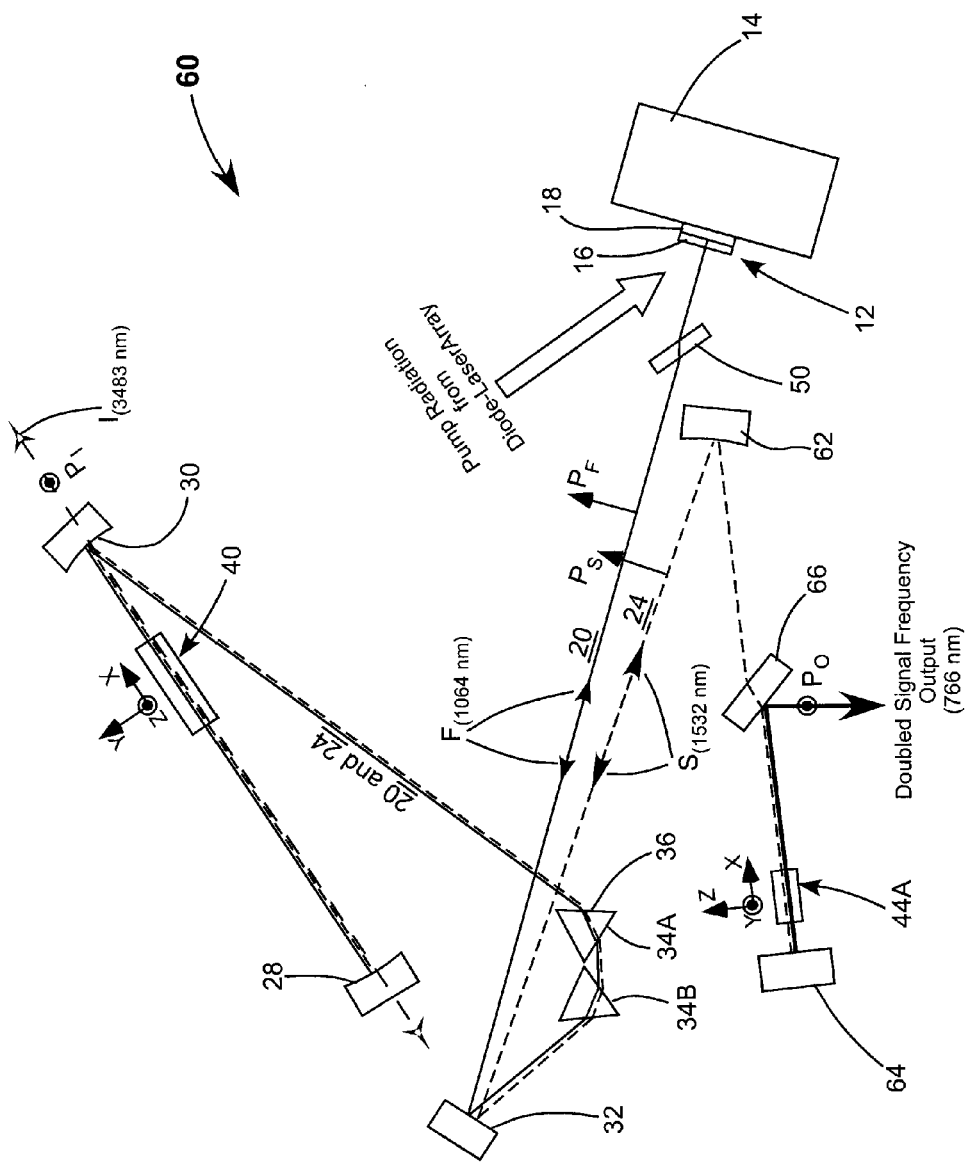
FIG. 5 schematically illustrates yet another preferred embodiment of laser apparatus in accordance with the present invention similar to the apparatus of FIG. 3, with an exception that the resonator is reconfigured such that the fundamental radiation is not transmitted by the second optically nonlinear crystal.

FIG. 5 schematically illustrates yet another preferred embodiment 60 of laser apparatus in accordance with the present invention. Apparatus 60 is similar to apparatus 10A of FIG. 3, with exceptions as follows. In apparatus 60, the reflective optical relay formed in apparatus 10A by mirrors 22A and 28 is eliminated and mirror 28 is used at normal incidence to terminate resonators 22 and 24. The eliminated relay is replaced in apparatus 60 by a relay formed by a concave mirror 62 and a plane mirror 64, with mirror 62 replacing minor 26 of apparatus 10A, and minor 64 terminating resonator (branch) 24. Crystal 44A is located adjacent minor 64 in a beam waist position of the signal radiation. Signal radiation is frequency doubled in forward and reverse passes through the crystal. A dichroic beamsplitter directs the frequency-doubled signal radiation out of resonator 24 as output-radiation. In the FIG. 5 embodiment, the fundamental radiation does not circulate in crystal 44a, thus reducing the thermal load when compared to the arrangement of FIG. 3.

Apparatus in accordance with the present invention makes it possible to use a readily available OPS chip configured to generate fundamental radiation at one of the more common wavelengths such as 980 nm, or 1064 nm (used for solid-state laser or fiber laser pumping) to generate radiation by optical parametric generation combined with frequency conversion output radiation having a wavelength shorter than the wavelength of the fundamental radiation. By way of example the output radiation may have any wavelength in a range between about 550 nm and 850 nm. The wavelength range may be extended by using different crystals or different OPS wavelengths (fundamental wavelengths) for parametric generation. The above-described invention allows efficient generation of laser radiation having the above discussed useful red, orange and yellow wavelengths. The invention also allows convenient generation of radiation within a fundamental range characteristic of InGaAs alloys, without a need for the above discussed experimental configuration effort for designing a new OPS-chip.

In summary, the present invention is described above with reference to a preferred embodiment. The invention is not limited, however, to the embodiment described and depicted. Rather the invention is limited only by the claims appended hereto.

What is claimed is:

1. Optical apparatus, comprising:
   first and second resonators having first and second portions with the first resonator portions being coaxial and the second portions separate;
   an OPS-structure located in the second portion of the first resonator;
   a light source for delivering optical pump radiation to the OPS-structure such that laser radiation having a fundamental wavelength circulates in the first resonator;
   a first optically nonlinear crystal located in the coaxial first portions of the first and second resonators and arranged for optical parametric division of a portion of the fundamental wavelength radiation into signal radiation and idler radiation portions, the signal radiation portion having a wavelength greater than the wavelength of the fundamental-wavelength radiation and less than the wavelength of the idler radiation portion;
   an optical arrangement for directing the signal radiation into the second portion of the second resonator such that signal radiation circulates in the second resonator; and
   a second optically nonlinear crystal located in the second resonator, the second optically nonlinear crystal being arranged for frequency-converting circulating signal radiation to a wavelength shorter than the wavelength of the circulating fundamental wavelength radiation.

2. The apparatus of claim 1, wherein the second optically nonlinear crystal is located in the first portion of the second resonator and the frequency-conversion of the circulating signal radiation is effected by sum-frequency mixing of the circulating signal radiation with the circulating fundamental-wavelength radiation.

3. The apparatus of claim 1, wherein the second optically nonlinear crystal is located in the first portion of the second resonator and the frequency-conversion of the circulating signal radiation is effected by frequency-doubling the circulating signal radiation.

4. The apparatus of claim 1, wherein the second optically nonlinear crystal is located in the second portion of the second resonator and the frequency-conversion of the circulating signal radiation is effected by frequency-doubling the circulating signal radiation.

5. The apparatus of claim 1, wherein the fundamental wavelength radiation has a wavelength between about 900 nanometers and about 1100 nanometers.

6. The apparatus of claim 1, wherein the second optically nonlinear crystal is a crystal of lithium triborate (LBO).

7. The apparatus of claim 1, wherein the first optically nonlinear crystal is a crystal of potassium titanyl arsenate (KTA).

8. The apparatus of claim 7, wherein the fundamental wavelength radiation has a wavelength of about 1064 nanometers and the frequency-doubled.

9. The apparatus of claim 1, wherein the first optically nonlinear crystal has a first bandwidth for the parametric division and the second optically nonlinear crystal has a second bandwidth for frequency-conversion and wherein the second bandwidth is greater than the first bandwidth.

10. The apparatus of claim 1, wherein the optical arrangement for directing the signal radiation into the second portion of the second resonator is a pair of isosceles Brewster prisms.

11. The apparatus of claim 10, wherein the prisms are LBO prisms having an apex angle of about 63.8 degrees.

12. Optical apparatus, comprising:
   first and second resonators having first and second portions with the first resonator portions being coaxial and the second portions separate;
   an OPS-structure located in the second portion of the first resonator;
   a light source for delivering optical pump radiation to the OPS-structure such that laser radiation having a fundamental wavelength circulates in the first resonator;

a first optically nonlinear crystal located in the coaxial first portions of the first and second resonators and arranged for optical parametric division of a portion of the fundamental wavelength radiation into signal radiation and idler radiation portions, the signal radiation portion having a wavelength greater than the wavelength of the fundamental-wavelength radiation and less than the wavelength of the idler radiation portion;

an optical arrangement for directing the signal radiation into the second portion of the second resonator such that signal radiation circulates in the second resonator;

a second optically nonlinear crystal located in the second resonator, the second optically nonlinear crystal being arranged for frequency-doubling circulating signal radiation to a wavelength shorter than the wavelength of the circulating fundamental wavelength radiation.

13. The apparatus of claim 12, wherein the second optically nonlinear crystal is located in the first portion of the second resonator.

14. The apparatus of claim 12, wherein the second optically nonlinear crystal is located in the second portion of the second resonator.

15. The apparatus of claim 11, wherein the fundamental-wavelength radiation has a wavelength between about 900 nanometers and about 1100 nanometers.

16. The apparatus of claim 15, wherein the fundamental-wavelength radiation has a wavelength of about 1064 nm and the frequency-doubled signal radiation has a wavelength of about 766 nm.

17. The apparatus of claim 12, wherein the second optically nonlinear crystal is a crystal of lithium triborate (LBO).

18. The apparatus of claim 12, wherein the first optically nonlinear crystal is a crystal of potassium titanyl arsenate (KTA).

19. A method of generating optical radiation comprising the steps of:

generating laser radiation having a fundamental wavelength with a gain medium in the form of an optically pumped semiconductor (OPS);

circulating the fundamental-wavelength radiation through a first optically nonlinear crystal arranged to divide a portion of the circulating fundamental wavelength radiation into signal wavelength and idler wavelength radiation portions, the signal wavelength being longer than the fundamental wavelength and shorter than the idler wavelength; and circulating the signal-wavelength radiation through a second optically nonlinear crystal arranged to generate output-radiation by frequency-converting the signal radiation.

20. The method of claim 19, wherein the signal radiation is frequency-converted by frequency doubling.

21. The method of claim 20, wherein the fundamental wavelength is 1064 nm and the output radiation has a wavelength of 766 nm.

* * * * *